(12) United States Patent
Uzawa et al.

(10) Patent No.: US 10,680,567 B2
(45) Date of Patent: Jun. 9, 2020

(54) LOW-NOISE MICROWAVE AMPLIFIER UTILIZING SUPERCONDUCTOR-INSULATOR-SUPERCONDUCTOR JUNCTION

(71) Applicant: INTER-UNIVERSITY RESEARCH INSTITUTE CORPORATION NATIONAL INSTITUTES OF NATURAL SCIENCES, Mitaka-shi, Tokyo (JP)

(72) Inventors: Yoshinori Uzawa, Tokyo (JP); Takafumi Kojima, Tokyo (JP)

(73) Assignee: INTER-UNIVERSITY RESEARCH INSTITUTE CORPORATION NATIONAL INSTITUTES OE NATURAL SCIENCES, Tokyo (JP)

( * ) Notice: Subject to any disclaimer, the term of this patent is extended or adjusted under 35 U.S.C. 154(b) by 57 days.

(21) Appl. No.: 16/140,649

(22) Filed: Sep. 25, 2018

(65) Prior Publication Data

US 2019/0097117 A1    Mar. 28, 2019

(30) Foreign Application Priority Data

Sep. 25, 2017  (JP) .................................. 2017-184211

(51) Int. Cl.
*H03F 19/00*  (2006.01)
*H01L 39/22*  (2006.01)
(Continued)

(52) U.S. Cl.
CPC ........... *H03F 19/00* (2013.01); *H01L 39/223* (2013.01); *H01L 21/32058* (2013.01);
(Continued)

(58) Field of Classification Search
CPC . H01L 39/223; H01L 27/18; H01L 21/32058; H01L 21/76891;
(Continued)

(56) References Cited

U.S. PATENT DOCUMENTS 3,237,017 A    2/1966  Maurer et al.
4,955,085 A *  9/1990  Woody ..................... H03D 9/06
                                                  333/33

OTHER PUBLICATIONS

Winkler et al., "A 75-110 GHz SIS Mixer with Integrated Tuning and Coupled Gain", published in Proceedings of a NATO Advanced Research Workshop on Nonlinear Superconductive Electronics and of the Second Workshop on Josephson Devices, held Sep. 3-7, 1990, in Capri, Italy. (Year: 1990).*

(Continued)

*Primary Examiner* — Benny T Lee
*Assistant Examiner* — Hafizur Rahman
(74) *Attorney, Agent, or Firm* — Sughrue Mion, PLLC

(57) ABSTRACT

A low-noise wide band amplifier is realized utilizing a superconductor-insulator-superconductor (SIS) junction, quasiparticle frequency mixers connected in tandem or in cascade, a first quasiparticle mixer performs first frequency mixing with use of a first local signal having a frequency not less than twice a frequency of an input signal to the first quasiparticle mixer, a second quasiparticle mixer performs second frequency mixing with use of a second local signal having a frequency not more than twice a frequency of an input signal to the second quasiparticle mixer, and signal amplification is performed through frequency conversion by extracting, from among a plurality of signals generated with the first and the second frequency mixing, a signal in a (Continued)

frequency band not more than a frequency band of the signal before the first frequency mixing and the second frequency mixing, using a transmission line or a filter.

20 Claims, 6 Drawing Sheets

(51) Int. Cl.
 *H01L 27/18* (2006.01)
 *H01L 21/768* (2006.01)
 *H01L 21/3205* (2006.01)
 *H01L 23/532* (2006.01)
 *H01L 23/498* (2006.01)
 *H01L 29/43* (2006.01)

(52) U.S. Cl.
 CPC .. *H01L 21/76891* (2013.01); *H01L 23/49888* (2013.01); *H01L 23/53285* (2013.01); *H01L 27/18* (2013.01); *H01L 29/437* (2013.01)

(58) Field of Classification Search
 CPC ......... H01L 23/49888; H01L 23/53285; H01L 29/437; H03F 19/00; H03F 7/00
 USPC ........................................................ 330/4.5
 See application file for complete search history.

(56) References Cited

OTHER PUBLICATIONS

Cristiano, "Superconducting Radiation Sensor Applications: Detectors and Mixers", Encyclopedia of Materials: Science and Technology, Copyright 2002 Elsevier Science Ltd, pp. 1-4. (Year: 2002).*
Rashid, "THz Frequency Up-Conversion using Superconducting Tunnel Junction", IEEE Microwave and Wireless Components Letters, vol. 26, No. 10, Oct. 2016, pp. 831-833. (Year: 2016).*
Kojima et al., "Microwave amplification based on quasiparticle SIS up and down frequency converters", published in AIP Advances 8, 025206 (2018) (Year: 2018).*
J. Schleeh et al., "Ultralow-Power Cryogenic InP HEMT With Minimum Noise Temperature of 1 K at 6 GHz", IEEE Electron Device Letters, May 2012, pp. 664-666 (3 pages), vol. 33, No. 5.
Shirin Montazeri et al., "Ultra-Low-Power Cryogenic SiGe Low-Noise Amplifiers: Theory and Demonstration", IEEE Transactions on Microwave Theory and Techniques, Jan. 2016, pp. 178-187 (10 pages), vol. 64, No. 1.
Byeong Ho Eom et al., "A wideband, low-noise superconducting amplifier with high dynamic range", Nature Physics, Jul. 8, 2012, pp. 623-627 (5 pages), vol. 8.
Michael A. Tarasov et al., "DC SQUID RF Amplifiers", IEEE Transactions on Applied Superconductivity, Jun. 1992, pp. 79-83 (5 pages), vol. 2, No. 2.
C. Macklin et al., "A near-quantum-limited Josephson traveling-wave parametric amplifier", Science, Oct. 16, 2015, pp. 307-310 (5 pages including information page), vol. 350, Issue 6258.

* cited by examiner

LOW-NOISE MICROWAVE AMPLIFIER UTILIZING SUPERCONDUCTOR-INSULATOR-SUPERCONDUCTOR JUNCTION

BACKGROUND OF THE INVENTION

1. Field of the Invention

The present invention relates to a low-noise microwave amplifier in which an up-converter and a down-converter, each utilizing a superconductor-insulator-superconductor (SIS) junction, are connected in series.

A low-noise electromagnetic amplifier is used in various fields. In a radio astronomical field, for example, the low-noise electromagnetic amplifier is used to directly amplify an observed signal or to amplify an intermediate frequency signal obtained after heterodyne conversion, aiming to observe weak electromagnetic waves from the astronomical object. Similarly, in a quantum-bit research field, the low-noise electromagnetic amplifier is used to detect a weak signal from a quantum bit circuit, and is required to have ultralow-noise properties as in the radio astronomical field. In the above-described fields, an amplifier using a semiconductor, which operates at ultralow temperature and has wide band characteristics, is mainly used.

In the radio astronomical field, however, the number of pixels in an observation device has been increased in recent years, while an amplifier is needed for each pixel. On that occasion, the number of pixels is strongly restricted due to the refrigeration capacity of a refrigerator that is used to cool the low-noise electromagnetic amplifier, and such a restriction is problematic when semiconductor devices consuming high power are used.

Furthermore, in the quantum-bit research field, a superconducting quantum bit needs to be operated at the ultralow temperature, and the power consumption of the amplifier is demanded to be very low in order to maintain an environment under the ultralow temperature. Thus, a similar restriction to the above-described one also exists in the quantum-bit research field. Although a superconducting SQUID amplifier and a Josephson parametric amplifier have been developed to cope with the above restriction, there is a problem that a dynamic range is low and an operation band is narrow.

The electromagnetic amplifier, the superconducting SQUID amplifier, and the Josephson parametric amplifier, each using semiconductors as mentioned above, are disclosed, for example, in Non-Patent Literatures (NPLs) given below.

NPL 1 (IEEE ELECTRON DEVICE LETTERS (SWEDEN), Vol. 33, May 2012, pp. 664-666) discloses a cooled low-noise semiconductor amplifier using an indium phosphide (InP)-based high electron mobility transistor (HEMT). This device enables a lower-power and lower-noise operation to be realized than the related art using a gallium arsenide (GaAs)-based HEMT. The power consumption stated in NPL 1 is 0.33 mW as an operation minimum value, and 4 mW as a performance optimum value.

NPL 2 (IEEE Trans. MTT (USA), Vol. 64, January 2016, p. 178-p. 187) discloses a cooled low-noise semiconductor amplifier using a silicon-germanium (SiGe) heterojunction bipolar transistor. In this device, a low-power operation can be performed by minimizing a collector-emitter voltage. The power consumption is 0.3 mW.

NPL 3 (Nature Physics (USA), Vol. 8, August 2012, p. 623-p. 627) discloses a superconducting parametric amplifier using a NbTiN coplanar waveguide. This device utilizes the nonlinear effect of kinetic inductance, and needs to be cooled down to 0.1 Kelvin or below for operation.

NPL 4 (IEEE Trans. Appl. Supercond., Vol. 2, June 1992, p. 79-p. 83) discloses a superconducting amplifier using a superconducting quantum interference element. This device is featured in that the inductance of an input circuit is large and hence an operating frequency band is narrow.

NPL 5 (Science (USA), Vol. 350, October 2015, pp. 307-310) discloses a superconducting parametric amplifier using a Josephson junction. This device utilizes the nonlinear reactance effect of a Josephson current, and the operating temperature is 30 mK.

In addition, Patent Literature (PTL) 1 (U.S. Pat. No. 3,237,017) discloses an amplifier in which one up-converter and one down-converter, each constituted by a parameter-excited mixer circuit or a mixer circuit using a tunnel diode, are connected in tandem or in cascade.

2. Description of the Related Art

PTL 1: U.S. Pat. No. 3,237,017
NPL 1: IEEE ELECTRON DEVICE LETTERS (SWEDEN), Vol. 33, May 2012, pp. 664-666
NPL 2: IEEE Trans. MTT (USA), Vol. 64, January 2016, p. 178-p. 187
NPL 3: Nature Physics (USA), Vol. 8, August 2012, p. 623-p. 627
NPL 4: IEEE Trans. Appl. Supercond., Vol. 2, June 1992, p. 79-p. 83
NPL 5: Science (USA), Vol. 350, October 2015, pp. 307-310

SUMMARY OF THE INVENTION

The present invention is intended to realize a low-noise amplifier in which a noise temperature when operating as an amplifier is low, a frequency band is wide, and cooling and maintaining low temperature are easy because of exhibiting ultralow power consumption characteristics even when the plurality of amplifiers are mounted.

To that end, it is demanded that the low-noise amplifier is of the low-heat generating type, and that its operating temperature range is not a temperature range in which cooling is difficult to carry out. Those demands cannot be achieved with the related-art amplifiers disclosed in the above-cited literatures. More specifically, in one example of the related-art semiconductor amplifiers in which a tunnel diode is used, heat is generated due to application of direct current power, and the number of amplifiers capable of being mounted to a cryogenic stage has to be limited. Furthermore, the related-art superconducting amplifier requires a dilution refrigerator having high cooling capacity for the reason that the amplifier is assumed to be operated at 100 mK or below although the power consumption of the device itself is low. This causes a problem that the scale of a system is increased and large power is needed in operation of the system. When large power is needed, a difficulty occurs in practical use of the system in many cases because many astronomical observation sites are present in places where available power infrastructures are limited, such as a satellite, a high mountain, a desert, and the South Pole.

Moreover, the superconducting amplifiers disclosed in NPLs 3 and 5 are reported as having wide bands. However, because a frequency filter needs to be used to suppress a signal component for pumping near a pump frequency for parameter excitation at which a maximum gain is obtained, a problem arises in that an actually usable frequency band is restricted.

The present invention provides a low-noise microwave amplifier utilizing a superconductor-insulator-superconductor junction, the low-noise microwave amplifier including a circuit in which two quasiparticle mixers (frequency mixers) each utilizing the superconductor-insulator-superconductor (SIS) junction are connected in tandem or in cascade, wherein a first quasiparticle mixer performs first frequency mixing with use of a first local oscillation signal having a frequency not less than twice a frequency of an input signal to the first quasiparticle mixer, a second quasiparticle mixer performs second frequency mixing with use of a second local oscillation signal having a frequency not more than twice a frequency of an input signal to the second quasiparticle mixer, and signal amplification is performed with a conversion gain obtained through frequency conversion by outputting, from among a plurality of signals generated with the first frequency mixing and the second frequency mixing, a signal in a frequency band not more than a frequency band of the signal before being subjected to the first frequency mixing and the second frequency mixing.

In comparison with the related art, the feature of the present invention obtained with the above-described combination is novel in that the signal amplification is performed not only through down-conversion, but also through up-conversion. The above point can be said because the frequency conversion utilizing the SIS has been used in the down-conversion for receiving millimeter waves and submillimeter waves. Any microwave devices using the up-conversion with the SIS have not yet been reported until now.

According to another feature of the present invention, the low-noise microwave amplifier further includes a filter in addition to the above-mentioned circuit, wherein the signal amplification is performed with the conversion gain obtained through the frequency conversion by extracting, from among the plurality of signals generated with the first frequency mixing and the second frequency mixing, the signal in the frequency band not higher than the frequency band of the signal before being subjected to the first frequency mixing and the second frequency mixing, and the extraction is performed using the filter.

According to still another feature of the present invention, the first quasiparticle mixer is arranged on a signal input side, the second quasiparticle mixer is arranged on a signal output side, and an isolator for suppressing a signal propagating from the second quasiparticle mixer to the first quasiparticle mixer is arranged between the first quasiparticle mixer and the second quasiparticle mixer, and the first local oscillation signal used in the first quasiparticle mixer and the second local oscillation signal used in the second quasiparticle mixer are each applied from an input terminal or an output terminal on a higher frequency side of the relevant quasiparticle mixer.

According to still another feature of the present invention, the first local oscillation signal and the second local oscillation signal are each a signal from a common signal source, and a signal component resulting from cancellation between an increase and a decrease in frequency obtained with the first frequency mixing and the second frequency mixing is output.

According to still another feature of the present invention, a frequency up-conversion and a frequency down-conversion are performed respectively in a first quasiparticle mixer side and a second quasiparticle mixer side, the first local oscillation signal is applied to between the first quasiparticle mixer and the isolator, and the second local oscillation signal is applied to between the isolator and the second quasiparticle mixer, or is a signal that is given as the first local oscillation signal after passing through the isolator.

According to still another feature of the present invention, the two quasiparticle mixers are arranged on a common substrate, one or more Josephson oscillators are arranged on the substrate, the first local oscillation signal is a signal from a first Josephson oscillator, and the second local oscillation signal is a signal from the first or a second Josephson oscillator.

According to still another feature of the present invention, the low-noise microwave amplifier further includes selection means for selecting one from among the plurality of quasiparticle mixers, wherein two quasiparticle mixers given as the quasiparticle mixer selected by the selection means and another quasiparticle mixer other than the plurality of quasiparticle mixers are connected in tandem or in cascade, and wherein respective outputs of the plurality of quasiparticle mixers are selectively read out by the other quasiparticle mixer.

According to the present invention, as described above, the ultralow-noise amplifier is obtained by using a superconductor-insulator-superconductor (SIS) mixer, which has been widely utilized as an ultralow-noise frequency down-converter until now, as each of an ultralow-noise frequency up-converter and frequency down-converter, and by operating both the converters under setting at which a conversion gain is obtained, thereby realizing a combination of the up-converter and the down-converter capable of exhibiting the amplification action.

Because of using the SIS mixer as an amplification device, the present amplifier can operate with a wide operating frequency band width equivalent to that of the SIS mixer, and with extremely lower power consumption than that in the case of using semiconductors. The operating temperature is about a half the critical temperature of a superconducting material at which the low-noise operation of the SIS mixer can be performed. Accordingly, when the present amplifier is mounted to a refrigerator, a heat load imposed on the refrigerator is greatly reduced. Moreover, since the present amplifier realizes amplification by utilizing the conversion gain that is generated with the frequency conversion in the SIS mixer, there are in principle no elements restricting an operating frequency range, which have been experienced in a traveling-wave superconducting parametric amplifier.

BRIEF DESCRIPTION OF THE DRAWINGS

FIG. 1A illustrates an example in which the two frequency mixers use signals from different local oscillators. FIG. 1B illustrates an example in which a common local oscillator is used.

FIGS. 2B and 2D each illustrate an example in which a common local oscillator is used.

DESCRIPTION OF THE PREFERRED EMBODIMENT

First, operations of two mixers connected in tandem or in cascade are described.

Figure 1A:
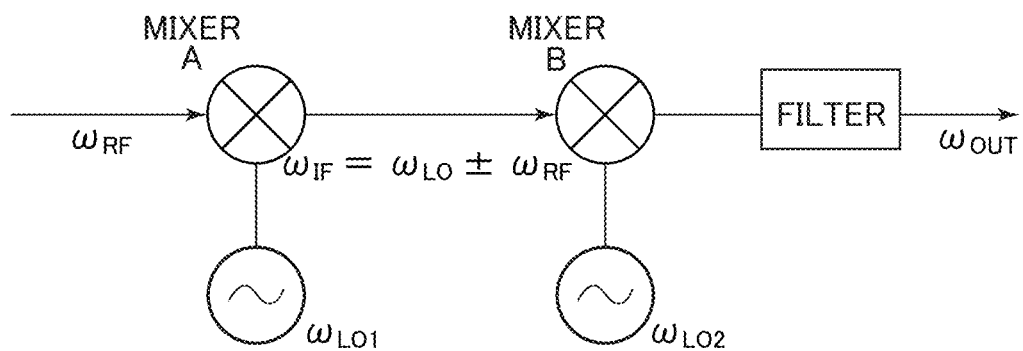
FIGS. 1A and 1B are basic conceptual views of the present invention and illustrate exemplary configurations in each of which two frequency mixers are connected in series (i.e., in tandem or in cascade).

Assume that a frequency conversion circuit is constituted by a mixer A receiving a signal having an angular frequency $\omega_{RF}$ and a mixer B receiving an output signal from the mixer A, the mixers A and B being connected in tandem or in cascade as illustrated in FIG. 1A, and that local oscillation signals $\cos(\omega_{LO1}t)$ and $\cos(\omega_{LO2}t)$ are input respectively to the mixers A and B from different local oscillators. For an input signal $S_{IN}=\cos(\omega_{RF}t)$, an output $S_{OUT}$ of this frequency conversion circuit is expressed by a composite signal resulting from four waves as given below.

$$S_{OUT} = \frac{1}{4}\begin{bmatrix} \cos((\omega_{RF}+\omega_{LO2}+\omega_{LO1})t) + \\ \cos((\omega_{RF}+\omega_{LO2}-\omega_{LO1})t) + \\ \cos((\omega_{RF}-\omega_{LO2}+\omega_{LO1})t) + \\ \cos((\omega_{RF}-\omega_{LO2}-\omega_{LO1})t) \end{bmatrix} \quad \text{[Math. 1]}$$

Figure 1B:
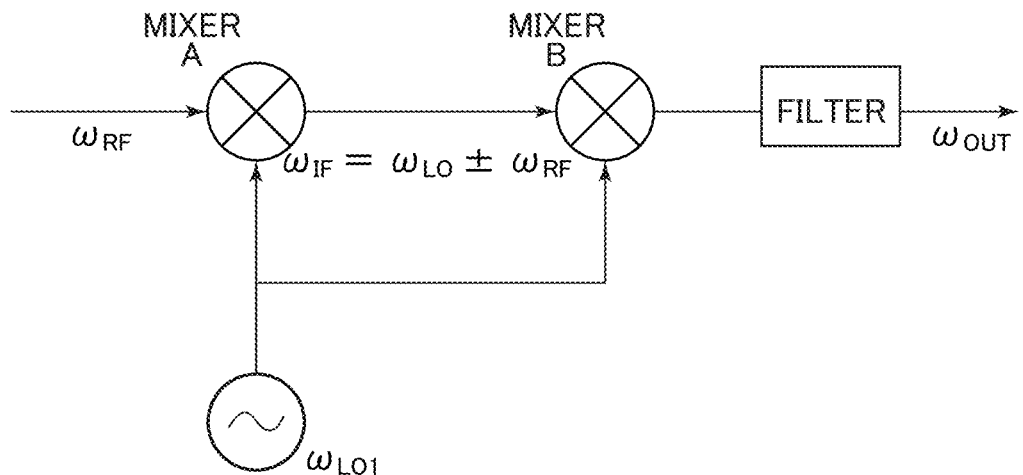

Assuming that a local oscillation signal $\cos(\omega_{LO}t)$ from a common local oscillator is used for both the mixers A and B as illustrated in FIG. 1B, $S_{OUT}$ is expressed by a composite signal resulting from three waves as given below.

$$S_{OUT} = \frac{1}{4}[\cos((\omega_{RF}+2\omega_{LO})t) + 2\cos((\omega_{RF})t) + \cos((\omega_{RF}-2\omega_{LO})t)] \quad \text{[Math. 2]}$$

When the mixer is used as an up-converter in the present invention, it is presumed that a frequency of the local oscillation signal input to the mixer is set to be not lower than twice a frequency of a frequency of the input signal to the mixer, and that double side bands on the output side are present in a higher frequency band than the input signal. When the mixer is used as a down-converter, it is assumed that an output containing a signal at a lower frequency than the input signal input to the mixer is provided. In the case of excluding a signal at a higher frequency than the input signal input to the mixer, such signal is excluded by a filter or by utilizing filtration characteristics of a transmission path. Taking the above point into account, it is presumed that a frequency of the local oscillation signal is set to be not more than twice a frequency of the input signal to the mixer, and that one of double side bands on the output side is present in a lower frequency band than the input signal.

An installed position of the filter is desirably set to the downstream side of both the mixers A and B. This is because a signal having a predetermined frequency is to be selected from the above-mentioned four waves or three waves after being subjected to frequency mixing in both the mixers instead of per mixer. When the filtration or similar processing is performed by a device in a subsequent stage, the filters illustrated in FIGS. 1A and 1B can be omitted.

The filtration characteristics of the transmission path can be provided by utilizing a propagation mode of a waveguide or a stripline.

In the case of using the above-mentioned four waves and processing a signal in sequence of the up-converter and the down-converter, for example, the frequency of the output signal can be made lower than that of the input signal by setting $\omega_{RF}<\omega_{LO1}<\omega_{LO2}$, and by selecting a signal having an angular frequency $\omega_{RF}+\omega_{LO1}-\omega_{LO2}$ with the filter.

In the case of using the above-mentioned four waves and processing a signal in sequence of the down-converter and the up-converter, the frequency of the output signal can be made lower than that of the input signal by setting $\omega_{RF}>\omega_{LO1}>\omega_2$, and by selecting a signal having an angular frequency $\omega_{RF}-\omega_{LO1}+\omega_{LO2}$ with the filter.

In the case of using the above-mentioned three waves and processing a signal in sequence of the up-converter and the down-converter, it appears from the above simplified mathematical formula that the frequency of the local oscillation signal can be arbitrarily selected. In fact, however, because the conversion gain has, for example, frequency dependency, it is desired to make an optimization from the viewpoint of such frequency dependency. Moreover, because the intensity of a signal component having the frequency $\omega_{RF}$ in the output signal is twice that of other components, selecting such signal component with the filter is advantageous from the viewpoint of gain. In this connection, however, the above simplified mathematical formula is premised on that there is no phase difference between the local oscillation signals. Thus, particularly in practical use, the common local oscillator is desirably arranged such that a path running from the common local oscillator to the mixer B via the mixer A and a path running from the common local oscillator directly to the mixer B have the same electrical length.

Example 1

FIGS. 2A to 2D illustrate basic exemplary configurations of the present invention. Of FIGS. 2A to 2D, FIG. 2A illustrates an example in which one frequency up-converter and one frequency down-converter are connected in series (i.e., in tandem or in cascade) and are operated as an amplifier. An up-converter 1 and a down-converter 2 are each a quasiparticle mixer utilizing a superconductor-insulator-superconductor (SIS) junction. At temperature not more than the temperature at which the SIS operates as a superconducting element, each of the SIS quasiparticle mixers operates as a double side band (DSB) mixer for a local oscillation frequency signal at a frequency not less than the gap frequency, which is a frequency equivalent (e$\Delta$Vg/h: e denotes the elementary charge, and h denotes the Plank's constant) of a gap voltage width ($\Delta$Vg). In the configuration illustrated in FIG. 2A, an input signal having a frequency $f_{RF}$ is frequency-converted to $f_{IF}$ (=$f_{LO}\pm f_{RF}$) with a gain $G_{UP}$ using the up-converter 1 for which the local oscillation frequency is set to $f_{LO1}$, and is down-converted using the down-converter 2 for which the local oscillation frequency is set to $f_{LO2}$. It is assumed that filters or transmission paths having filtration characteristics, which are required for the appropriate filtrations, are provided in the up-converter 1 and the down-converter 2.

Figure 2A:
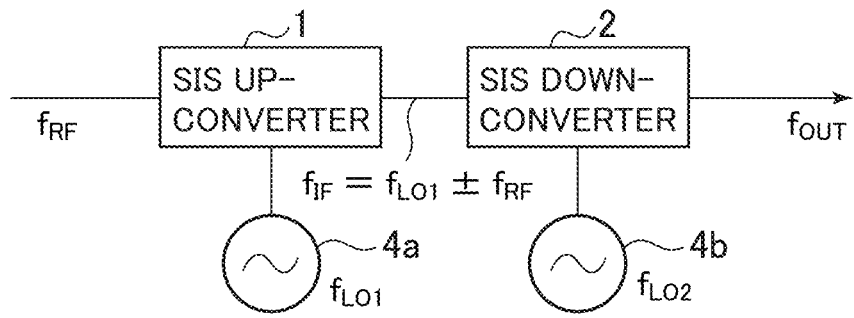
FIGS. 2A, 2B, 2C and 2D are basic conceptual views of the present invention and illustrate configurations in which one frequency up-converter and one frequency down-converter are connected in series (i.e., in tandem or in cascade) and are operated as an amplifier, the up-converter and the down-converter being each a quasiparticle mixer utilizing a superconductor-insulator-superconductor (SIS) junction. An intermediate frequency ($f_{IF}$) is relatively high in FIGS. 2A and 2B, and is relatively low in FIGS. 2C and 2D. Furthermore, FIGS. 2A and 2C each illustrate an example in which different local oscillators are used for the up-converter and the down-converter.
Figure 2B:
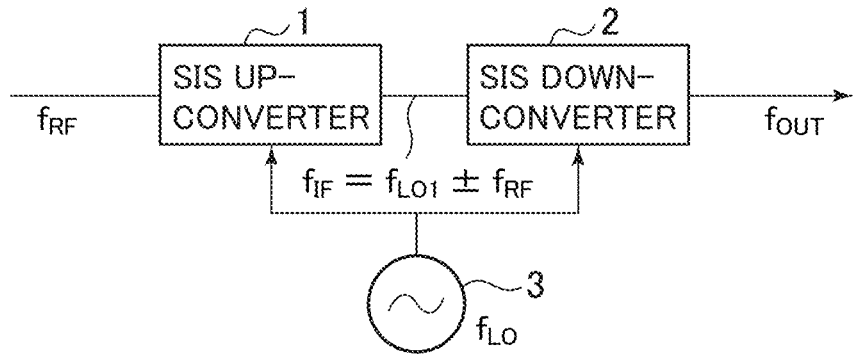

FIG. 2B illustrates an amplifier in which a signal having a frequency $f_{CUT}$ (=$f_{RF}$) is obtained by performing frequency conversion to $f_{CUT}$ (=$f_{IF}-f_{LO1}$) with a gain $G_{DOWN}$ while a signal having the same local oscillation frequency as $f_{LO1}$ in the above case is used in the down-converter 2.

Figure 2C:
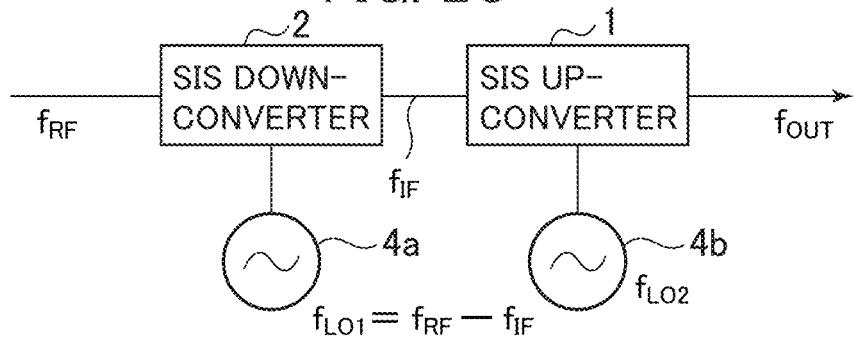
Figure 2D:
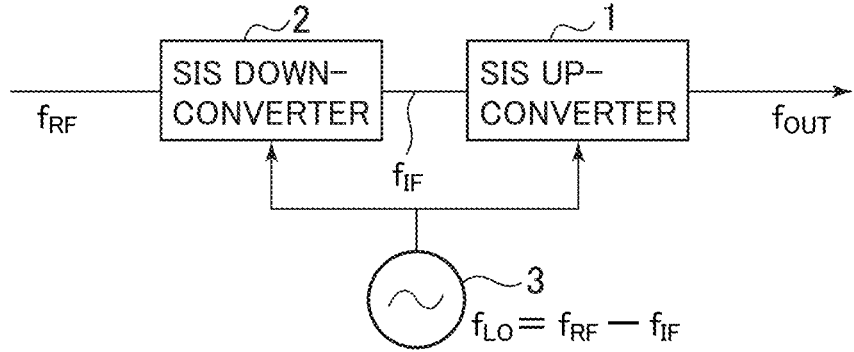

In the configuration illustrated in FIG. 2C, an input signal is passed from the down-converter 2 to the up-converter 1, thereby amplifying the signal with a conversion gain in each of the converters. In the configuration illustrated in FIG. 2D, particularly, a signal in the same frequency band as the input signal is output.

When, for example, a rectangular waveguide having frequency selectivity in a transmission path itself is used as a signal transmission path, a transmission signal can be filtered by utilizing cut-off frequency characteristics of the rectangular waveguide. When, for example, a stripline having no frequency selectivity is used as the signal transmission path, a filter for selecting a predetermined frequency component may be arranged for each of the up-converter and the down-converter. However, the number of filters necessary for the filtration can be reduced by selecting a predetermined frequency component with a filter after performing the frequency mixing in both of the two quasiparticle mixers.

A key point in the present amplifier is that a conversion gain of 1 or more (i.e., $G_{UP} \times G_{DOWN} > 1$) is obtained with the quasiparticle mixers. From that point of view, a numerical simulation to evaluate an overall gain in the configuration of FIG. 2B is described below.

Figure 3A:
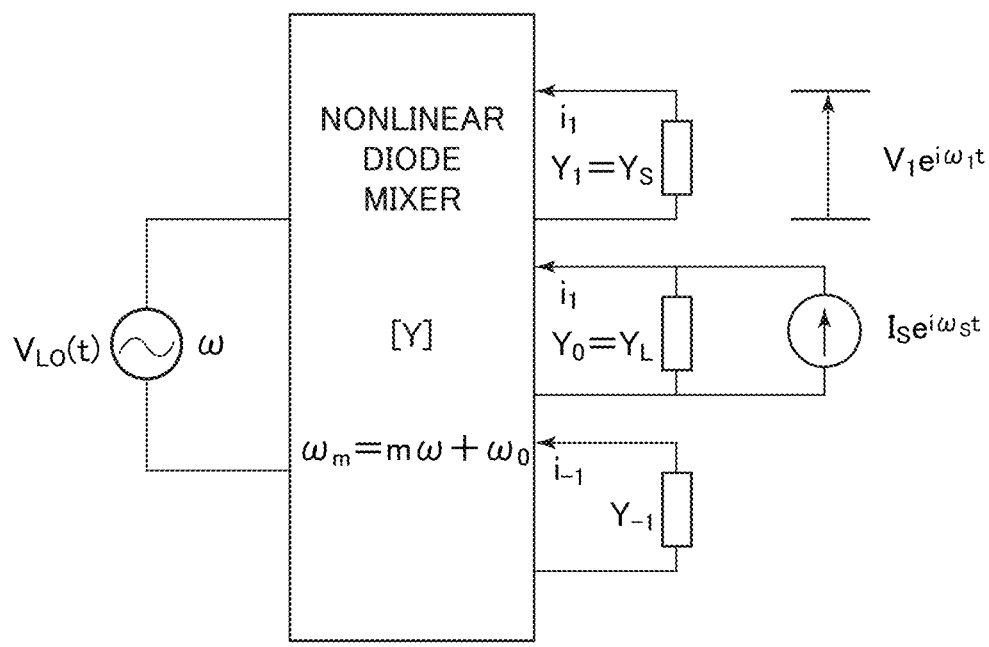
FIG. 3A illustrates a theoretical model used in a numerical simulation of a conversion gain in the quasiparticle mixer.
Figure 3B:
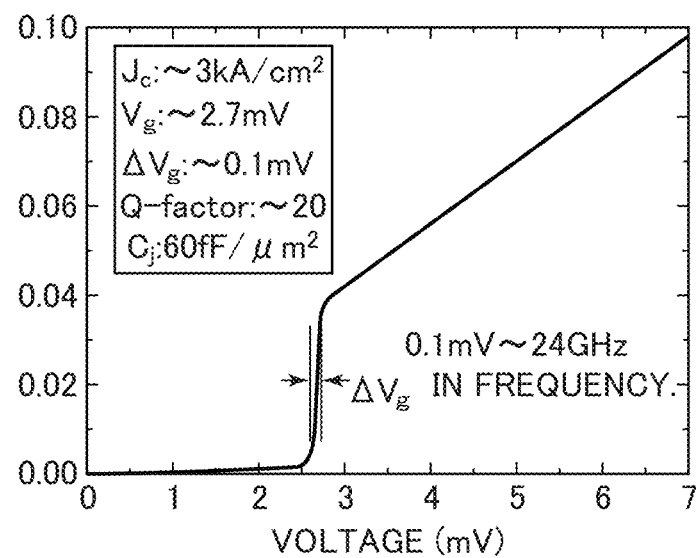
FIG. 3B depicts current-voltage characteristics used in calculation for the quasiparticle mixer.

First, FIG. 3A illustrates an SIS quasiparticle mixer model based on the Tucker theory, which is used in the numerical simulation and which introduces the quantum effect into the classical nonlinear diode mixer theory, and FIG. 3B depicts current-voltage (I-V) characteristics of a Nb/AlOx/Nb junction, which are used in calculation. It is assumed that the SIS junction is one obtained in a standard case, and that a critical current density is 3 kA/cm$^2$, an area is 1 $\mu$m$^2$, and a capacitance is 60 fF/$\mu$m$^2$.

FIGS. 4S and 4A to 4D depict examples of a gain distribution in the SIS quasiparticle up-converter, the gain distribution being calculated using the model illustrated in FIGS. 3A and 3B. An impedance of a signal source connected to an input of the up-converter is fixed to 50$\Omega$, and a load impedance connected to an output of the up-converter is changed. A Smith chart represents the changed output load impedance and is normalized to a normal resistance value (71$\Omega$) of the SIS junction. The LO frequency is 30 GHz.

As seen from FIGS. 4S and 4A to 4D, the gain is obtained over a wide region of the output load impedance. In order to obtain the gain, however, it is required, as in the down-converter, to select a frequency higher than that corresponding to a nonlinear voltage scale ($\Delta V_g$) in the I-V characteristic of the SIS junction. For example, $\Delta V_g$»0.1 mV»24 GHz or thereabout are required in this case.

Figure 4S:
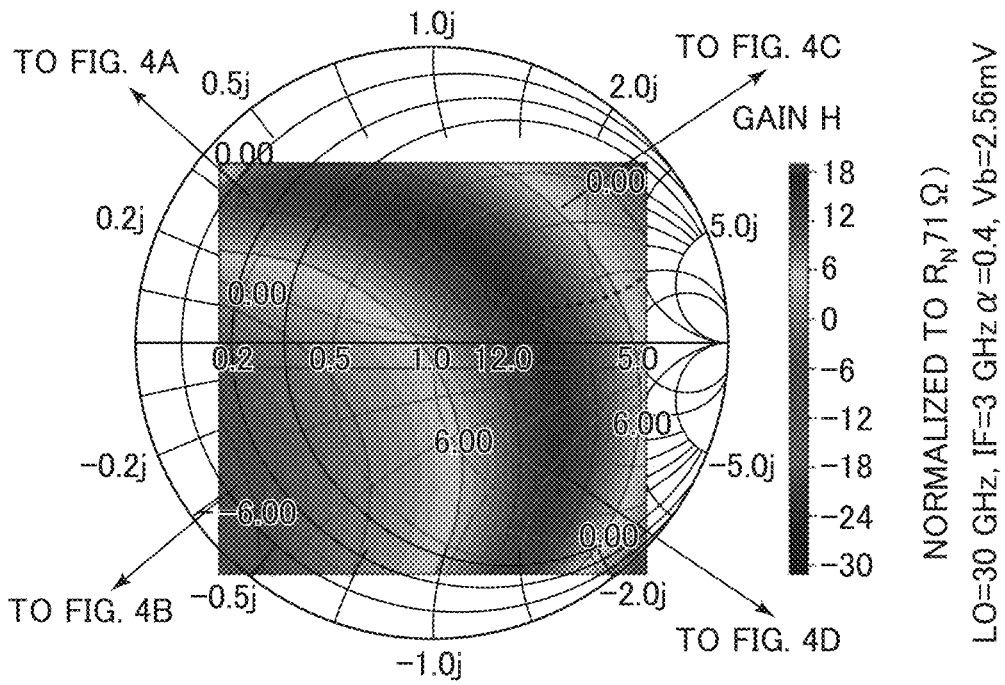
FIGS. 4S and 4A to 4D depict examples of a gain distribution in a quasiparticle up-converter, the gain distribution being calculated using the models in FIGS. 3A and 3B.
Figure 4A:
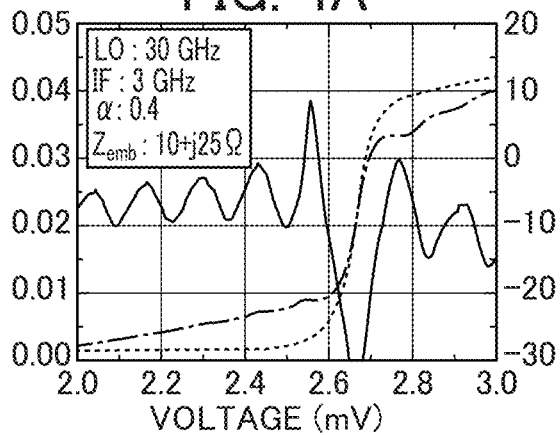
Figure 4C:
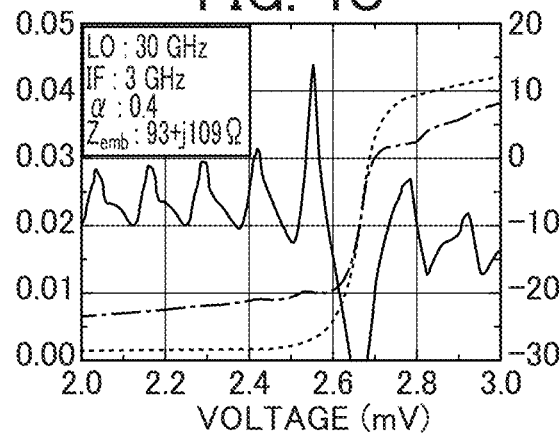
Figure 4B:
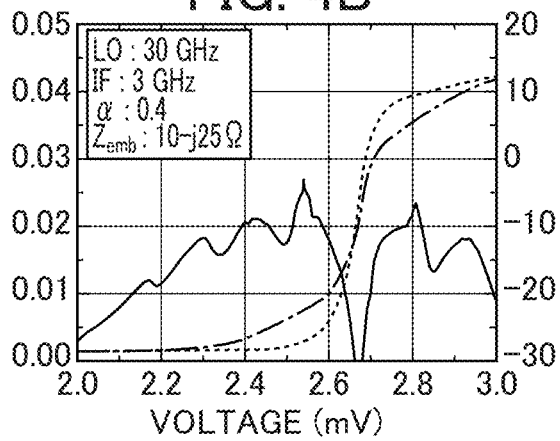
Figure 4D:
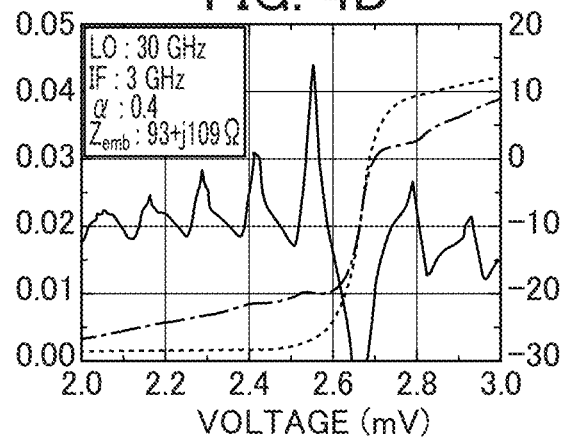

Furthermore, as seen from FIG. 4S, the high gain region is present along an equi-conductance line rather than an equi-impedance line, and hence circuit adjustment to maintain a high gain state is desirably performed along the equi-conductance line.

Regarding the down-converter side, it is already theoretically and experimentally known that the frequency conversion gain and the quantum noise performance can be obtained with the SIS quasiparticle mixer. On the basis of such known matters, it can be concluded from the above-described simulation analysis that the frequency conversion gain and the quantum noise performance, which are effective in practical use, can be similarly obtained with the up-converter.

When the up-converter and the down-converter are connected in tandem or in cascade, each of the SIS quasiparticle mixers operates as a double side band (DSB) mixer, and hence theoretical minimum noise temperatures are given by $hf_{RF}/2 k_B$ and $hf_{IF}/2 k_B$ for the up-converter and the down-converter, respectively, on an assumption that h denotes the Plank's constant and $k_B$ denotes the Boltzmann's constant. Assuming respective gains of the mixers to be $G_{UP}$ and $G_{DOWN}$, a noise temperature $T_{amp}$ of the entire amplifier is expressed as follows.

$$T_{amp} = \frac{hf_{RF}}{2k_B} + \frac{1}{G_{UP}} \frac{hf_{IF}}{2k_B} \qquad \text{[Math. 3]}$$

Assuming, for example, $f_S$=5 GHz, $f_{LO}$=50 GHz, and $G_{UP}$=10 (10 dB), $T_{amp}$»0.24 K is resulted, and ultralow noise characteristics can be obtained. On the other hand, the gain $G_{amp}$ is given by $G_{amp}=G_{UP} \times G_{DOWN}$.

Because the present amplifier needs cryogenic cooling, power consumed by the amplifier is desirably as small as possible. The power consumption of the amplifier is a total of (1) an LO power component $P_{LO}$ and (2) a DC bias component $P_{DC}$ supplied to the SIS junctions in the up-converter and the down-converter.

(1) Regarding the LO power component $P_{LO}$, the LO power $P_{LO}$ is given by about $V_{LO}^2/2R_N$ on an assumption that an LO voltage applied to the SIS junction is $V_{LO}$. Here, $R_N$ denotes the normal resistance of the SIS junction. An amount of LO power for pumping the SIS junction is expressed by a parameter $\alpha=eV_{LO}/hf_{LO}$. Here, e denotes the electron charge. Since the LO power optimum as the frequency converter is usually $\alpha$=1 or less, the LO power $P_{LO}$ is estimated to be about $(hf_{LO}/e)^2/2R_N$. In the case of, for example, the SIS junction used in the above-described calculation, $P_{LO}$=0.3 nW is obtained on an assumption that $f_{LO}$ is 50 GHz. Thus, the total power consumption of the up-converter and the down-converter is 0.6 nW. Taking into account a portion that is not necessarily required to be cooled, however, the total LO power supplied to the present amplifier is 12 nW for the reason that the LO power is usually input via, for example, a directional coupler of about 1/20.

(2) Regarding the DC bias component $P_{DC}$ supplied to the SIS conjunction, the power consumption is 26 nW because a DC bias point is at about 2.6 mV and 0.01 mA. The total power consumption of the up-converter and the down-converter is 52 nW. Accordingly, the power consumption of the present amplifier is 64 nW. It is hence understood that the power consumption of the present amplifier is much smaller than the mW-order power consumption of a semiconductor amplifier.

Example 2

Figure 5A:
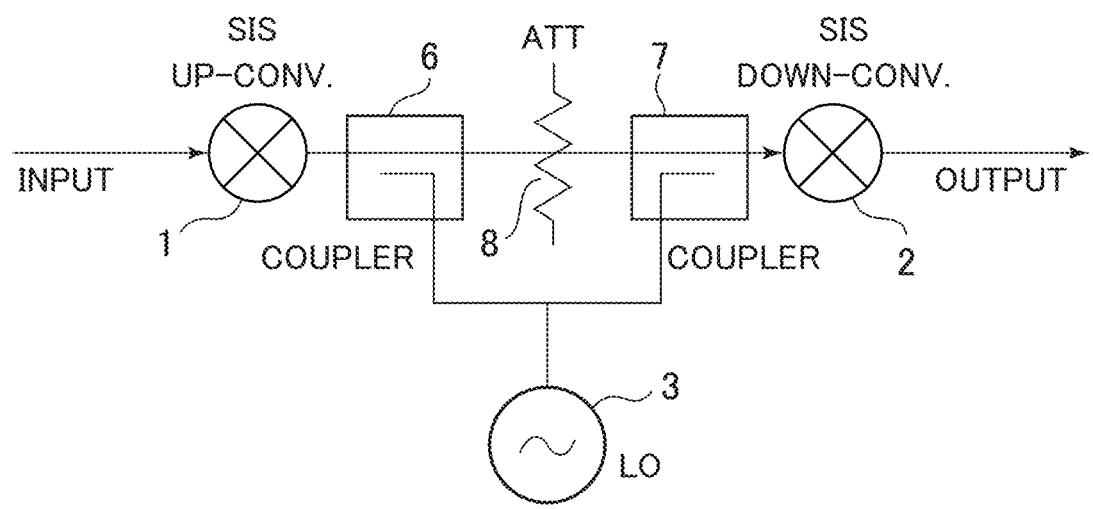
FIG. 5A is a block diagram of a low-noise microwave amplifier fabricated as a prototype for experimental evaluation of a gain.

FIG. 5A is a block diagram of a low-noise microwave amplifier fabricated as a prototype for experimental evaluation of a gain. SIS mixers used as the up-converter 1 and the down-converter 2 are the same as the converters designed in a 100-GHz band. For the purpose of suppressing interference in a circuit, an attenuator 8 is inserted between the up-converter 1 and the down-converter 2.

The attenuator 8 operates as an isolator. In other words, characteristics required for the isolator used in the present invention are to suppress a signal propagating from the second quasiparticle mixer to the first quasiparticle mixer. A directional coupler or a microwave isolator, for example, may also be used instead of the attenuator.

Figure 5B:
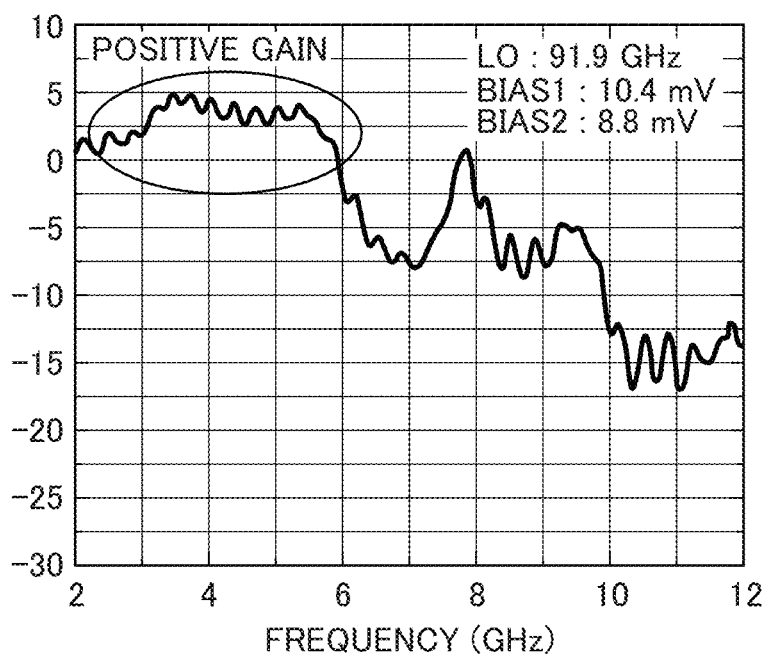
FIG. 5B depicts an evaluation result representing frequency dependency of the gain.

FIG. 5B depicts frequency dependency of the gain. Despite the above-described attenuator is arranged, a gain of about 3 dB is obtained in a 5-GHz band when the LO frequency is about 92 GHz. Since an attenuation of the attenuator at that frequency is about 5 dB, a gain obtained with the up-converter and the down-converter is 8 dB. It is hence understood that the combination of the up-converter and the down-converter operates as an amplifier.

Figure 6A:
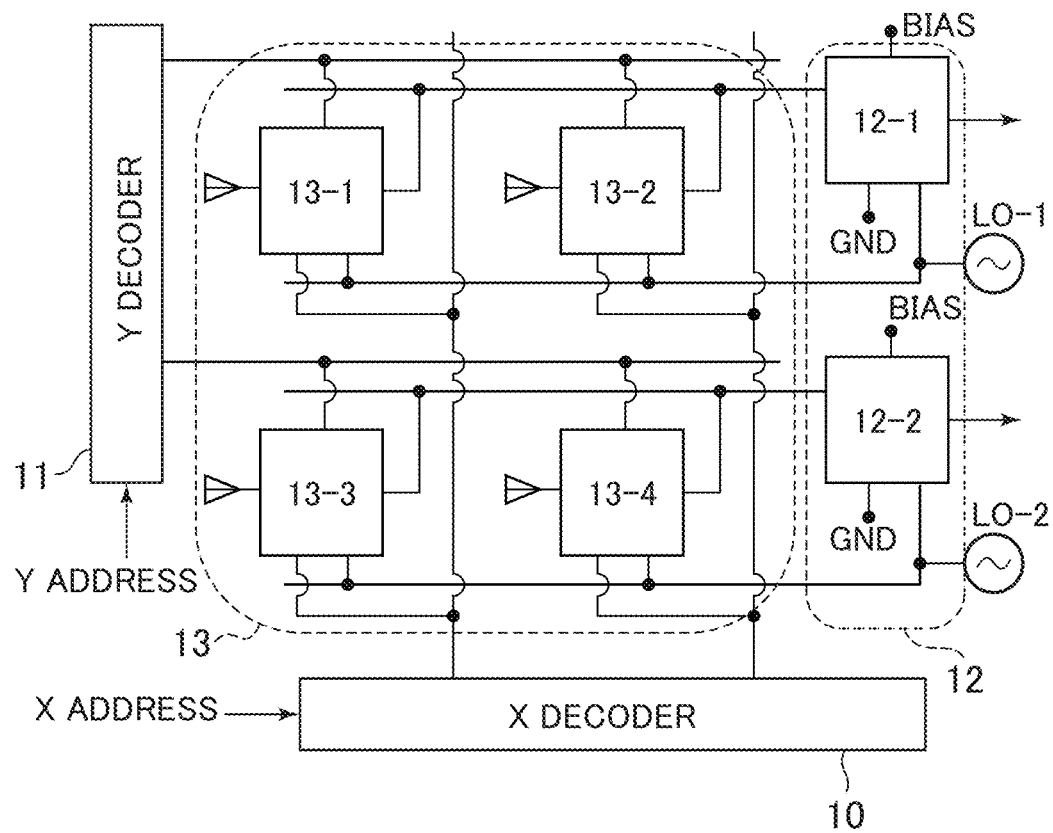
FIGS. 6A and 6B are basic conceptual views and illustrate an exemplary configuration of a microwave imaging device in which selection means for selecting one of a plurality of quasiparticle mixers is arranged, in which two quasiparticle mixers, i.e., the quasiparticle mixer selected by the selection means and another quasiparticle mixer, are connected in tandem or in cascade, and in which respective outputs of the quasiparticle mixers are selectively read out by the other quasiparticle mixer.

Although FIG. 6A does not illustrate a filter, a frequency filter is substantially used as a measuring device for obtaining the graph of FIG. 5B.

Example 3

As described above in relation to FIG. 1A, it is also possible to perform frequency conversion while the input signal is amplified, by using signals having different frequencies as the local oscillation signals for the up-converter and the down-converter. On that occasion, introducing a plurality of local oscillation signals into the quasiparticle mixers from external signal sources, respectively, means that external heats are also introduced together into a cryogenic region. Therefore, oscillation elements each having a similar structure to that of the SIS is desirably formed on the same substrate on which the above-described converters are formed. As such an oscillation element, there is Josephson oscillator using a Josephson current. It is known that thermal noise from an oscillation element under cryogenic environments is very low. Thus, a noise figure in the amplifier of the present invention can be easily improved by using that type of oscillation element. The above point is similarly applied to the case in which the up-converter and the down-converter are arranged with a signal flowing from the down-converter to the up-converter in order reversed to that in the above-mentioned case, and they are operated as an RF amplifier.

However, when the oscillation frequency is unstable even in the case of using the Josephson oscillator, the local oscillation signal from the common signal source is desirably used for the up-converter and the down-converter as illustrated in FIG. 1B, 2B, 2D, or 5A.

Example 4

FIG. 6A illustrates an exemplary configuration in which selection means for selecting one of a plurality of quasiparticle mixers is arranged, in which two quasiparticle mixers, i.e., the quasiparticle mixer selected by the selection means and another quasiparticle mixer, are connected in tandem or in cascade, and in which respective outputs of the quasiparticle mixers are selectively read out by the other quasiparticle mixer. In other words, a block diagram illustrated in FIG. 6A illustrates an exemplary configuration of a microwave imaging device. The quasiparticle mixers are arranged respectively in cells (13-1 to 13-4) that are arranged in a matrix pattern to define a microwave sensor region. Microwaves are applied to the entire matrix and are input to antennas (ANT) of the individual cells. The quasiparticle mixers are sequentially selected from the sensor region per row, and their outputs are read out by quasiparticle mixers which are connected at the right end and serve as sense amplifiers (12-1,2). In the illustrated example, read signals in individual rows are read out in parallel. In the case of sequentially selecting the quasiparticle mixers per row as described above, only an X decoder 10 suffices. In the case of reading the individual cells sequentially or at random, however, the cells are selected one by one using the X decoder 10 and a Y decoder 11 as illustrated in FIG. 6A. When the cells are selected one by one as in such a case, the outputs of the individual quasiparticle mixers in the sensor region can be collected into one transmission line.

Figure 6B:
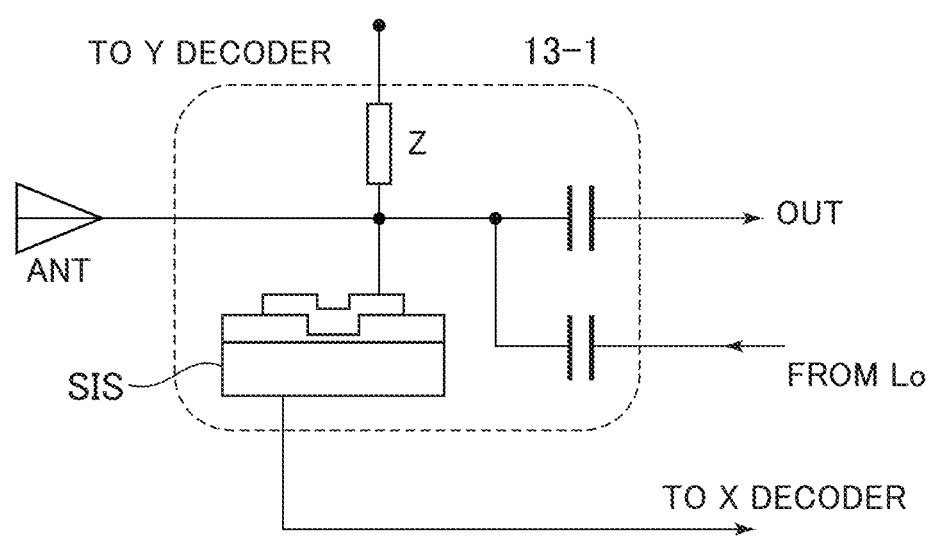

In the case of the X decoder illustrated in FIGS. 6A and 6B, 0 V is output to a select line, and $\Delta/2$ V is output to a non-select line. Here, $\Delta$ denotes a bias voltage during operation of the SIS, which is substantially equal to a gap voltage. The Y decoder outputs $\Delta V$ to a select line, and $\Delta/2$ V to a non-select line.

The quasiparticle mixer selected as described above comes to be capable of up-conversion, for example, and its output is converted to a predetermined frequency by the quasiparticle mixer serving as the sense amplifier for the row to which the relevant cell belongs.

The quasiparticle mixer in the cell may perform down-conversion, and the quasiparticle mixer serving as the sense amplifier may perform up-conversion.

The output of the sense amplifier is received by a receiver for the above-mentioned predetermined frequency, and is subjected to signal processing after being converted to a digital signal.

Local oscillators LO-1 and LO-2 in FIG. 6A may generate signals having the same frequency each other. Thus, a signal from one signal source may be used, by way of example, after being branched. From the viewpoint of avoiding signal interference between the rows, however, individual signal sources are desirably designed to have different oscillation frequencies from each other.

FIG. 6B illustrates an internal configuration of each of the cells (13-1 to 13-4) using the quasiparticle mixers. An SIS diode constituting a quasiparticle element is used, and it operates as the quasiparticle mixer by applying a potential difference, that corresponds to the gap voltage, across the SIS diode.

The configurations illustrated in FIGS. 6A and 6B are desirably integrated to one common substrate from the viewpoint of maintaining the individual elements at a constant temperature. Such integration can be easily implemented by the known manufacturing process technology for a semiconductor integrated device.

It is apparent that integrating further the local oscillators LO to the above-described substrate in a process for the above-described integration is desirable from the viewpoint of reducing the number of lead-out lines and suppressing a load of refrigeration to maintain the ultralow temperature.

For example, the above-described Josephson oscillator is known as an oscillator capable of not only operating in a THz band under cryogenic environments with low power consumption, but also easily realizing a high degree of integration. In a manufacturing process for the Josephson oscillator, superconducting films for the SIS mixer and the oscillator can be formed by a common film.

The present invention can realize a low-noise amplifier and a supersensitive THz-wave imaging spectroscopic apparatus for signals in a THz band. As a result, a practical value of the THz-band as radio resources can be heightened. In the radio astronomic field, for example, it comes possible to perform wide-field spectroscopic observation that has been infeasible until now. In addition, the present invention can be further utilized in a large-scale superconducting quantum computer.

What is claimed is:

1. A low-noise microwave amplifier utilizing a superconductor-insulator-superconductor junction, the low-noise microwave amplifier comprising a circuit in which a first quasiparticle mixer and a second quasiparticle mixer each utilizing the superconductor-insulator-superconductor junction are connected in tandem or in cascade,
wherein the first quasiparticle mixer performs first frequency mixing with use of a first local oscillation signal having a frequency not less than twice a frequency of an RF input signal to the first quasiparticle mixer, the second quasiparticle mixer performs second frequency mixing with use of a second local oscillation signal having a frequency not more than twice a frequency of an IF input signal to the second quasiparticle mixer, and signal amplification is performed with a conversion gain obtained through frequency conversion by outputting, from among a plurality of signals generated with the first frequency mixing and the second frequency mixing, a signal in a frequency band not more than a frequency band of the RF signal before being subjected to the first frequency mixing and the second frequency mixing.

2. The low-noise microwave amplifier utilizing the superconductor-insulator-superconductor junction according to claim 1, further comprising a filter connected to the amplifier,
wherein the signal amplification is performed with the conversion gain obtained through the frequency conversion by extracting, from among the plurality of signals generated with the first frequency mixing and the second frequency mixing, the signal in the frequency band not more than the frequency band of the signal before being subjected to the first frequency mixing and the second frequency mixing, and the extraction is performed using the filter.

3. The low-noise microwave amplifier utilizing the superconductor-insulator-superconductor junction according to claim 2, wherein the first and second quasiparticle mixers are arranged on a common substrate,
one or more Josephson oscillators are arranged on the substrate,
the first local oscillation signal is a signal from a first Josephson oscillator, and
the second local oscillation signal is a signal from the first or a second Josephson oscillator.

4. The low-noise microwave amplifier utilizing the superconductor-insulator-superconductor junction according to claim 2,
wherein the first quasiparticle mixer is arranged on a signal input side, the second quasiparticle mixer is arranged on a signal output side, and an isolator for suppressing a signal propagating from the second quasiparticle mixer to the first quasiparticle mixer is arranged between the first quasiparticle mixer and the second quasiparticle mixer, and
wherein the first local oscillation signal used in the first quasiparticle mixer and the second local oscillation signal used in the second quasiparticle mixer are applied from an input terminal on a higher frequency side of the second quasiparticle mixer or an output terminal on a higher frequency side of the first quasiparticle mixer.

5. The low-noise microwave amplifier utilizing the superconductor-insulator-superconductor junction according to claim 4, wherein the first and second quasiparticle mixers are arranged on a common substrate,
one or more Josephson oscillators are arranged on the substrate,
the first local oscillation signal is a signal from a first Josephson oscillator, and
the second local oscillation signal is a signal from the first or a second Josephson oscillator.

6. The low-noise microwave amplifier utilizing the superconductor-insulator-superconductor junction according to claim 4, wherein a frequency up-conversion and a frequency down-conversion are performed respectively in the first quasiparticle mixer and the second quasiparticle mixer,
the first local oscillation signal is applied between the first quasiparticle mixer and the isolator, and
the second local oscillation signal is applied between the isolator and the second quasiparticle mixer.

7. The low-noise microwave amplifier utilizing the superconductor-insulator-superconductor junction according to claim 6, wherein the first and second quasiparticle mixers are arranged on a common substrate,
one or more Josephson oscillators are arranged on the substrate,
the first local oscillation signal is a signal from a first Josephson oscillator, and
the second local oscillation signal is a signal from the first or a second Josephson oscillator.

8. The low-noise microwave amplifier utilizing the superconductor-insulator-superconductor junction according to claim 4, wherein the first local oscillation signal and the second local oscillation signal are each a signal from a common signal source, and a signal component resulting from an increase and a decrease in frequency obtained with the first frequency mixing and the second frequency mixing respectively is output.

9. The low-noise microwave amplifier utilizing the superconductor-insulator-superconductor junction according to claim 8, wherein the first and second quasiparticle mixers are arranged on a common substrate,
one or more Josephson oscillators are arranged on the substrate,
the first local oscillation signal is a signal from a first Josephson oscillator, and
the second local oscillation signal is a signal from the first or a second Josephson oscillator.

10. The low-noise microwave amplifier utilizing the superconductor-insulator-superconductor junction according to claim 2, wherein the first local oscillation signal and the second local oscillation signal are each a signal from a common signal source, and a signal component resulting from an increase and a decrease in frequency obtained with the first frequency mixing and the second frequency mixing respectively is output.

11. The low-noise microwave amplifier utilizing the superconductor-insulator-superconductor junction according to claim 10, wherein the first and second quasiparticle mixers are arranged on a common substrate,
one or more Josephson oscillators are arranged on the substrate,
the first local oscillation signal is a signal from a first Josephson oscillator, and
the second local oscillation signal is a signal from the first or a second Josephson oscillator.

12. The low-noise microwave amplifier utilizing the superconductor-insulator-superconductor junction according to claim 1,
wherein the first quasiparticle mixer is arranged on a signal input side, the second quasiparticle mixer is arranged on a signal output side, and an isolator for suppressing a signal propagating from the second quasiparticle mixer to the first quasiparticle mixer is arranged between the first quasiparticle mixer and the second quasiparticle mixer, and
wherein the first local oscillation signal used in the first quasiparticle mixer and the second local oscillation signal used in the second quasiparticle mixer are applied from an input terminal on a higher frequency side of the second quasiparticle mixer or an output terminal on a higher frequency side of the first quasiparticle mixer.

13. The low-noise microwave amplifier utilizing the superconductor-insulator-superconductor junction according to claim 12, wherein the first and second quasiparticle mixers are arranged on a common substrate,
one or more Josephson oscillators are arranged on the substrate,
the first local oscillation signal is a signal from a first Josephson oscillator, and
the second local oscillation signal is a signal from the first or a second Josephson oscillator.

14. The low-noise microwave amplifier utilizing the superconductor-insulator-superconductor junction according to claim 12, wherein a frequency up-conversion and a frequency down-conversion are performed respectively in the first quasiparticle mixer and the second quasiparticle mixer,
the first local oscillation signal is applied between the first quasiparticle mixer and the isolator, and
the second local oscillation signal is applied between the isolator and the second quasiparticle mixer.

15. The low-noise microwave amplifier utilizing the superconductor-insulator-superconductor junction according to claim 14, wherein the first and second quasiparticle mixers are arranged on a common substrate,
one or more Josephson oscillators are arranged on the substrate,
the first local oscillation signal is a signal from a first Josephson oscillator, and
the second local oscillation signal is a signal from the first or a second Josephson oscillator.

16. The low-noise microwave amplifier utilizing the superconductor-insulator-superconductor junction according to claim 12, wherein the first local oscillation signal and the second local oscillation signal are each a signal from a common signal source, and a signal component resulting from an increase and a decrease in frequency obtained with the first frequency mixing and the second frequency mixing receptively is output.

17. The low-noise microwave amplifier utilizing the superconductor-insulator-superconductor junction according to claim 16, wherein the first and second quasiparticle mixers are arranged on a common substrate,
one or more Josephson oscillators are arranged on the substrate,
the first local oscillation signal is a signal from a first Josephson oscillator, and
the second local oscillation signal is a signal from the first or a second Josephson oscillator.

18. The low-noise microwave amplifier utilizing the superconductor-insulator-superconductor junction according to claim 1, wherein the first and second quasiparticle mixers are arranged on a common substrate,
one or more Josephson oscillators are arranged on the substrate,
the first local oscillation signal is a signal from a first Josephson oscillator, and
the second local oscillation signal is a signal from the first or a second Josephson oscillator.

19. The low-noise microwave amplifier utilizing the superconductor-insulator-superconductor junction according to claim 1, wherein the first local oscillation signal and the second local oscillation signal are each a signal from a common signal source, and a signal component resulting from an increase and a decrease in frequency obtained with the first frequency mixing and the second frequency mixing respectively is output.

20. The low-noise microwave amplifier utilizing the superconductor-insulator-superconductor junction according to claim 19, wherein the first and second quasiparticle mixers are arranged on a common substrate,
one or more Josephson oscillators are arranged on the substrate,
the first local oscillation signal is a signal from a first Josephson oscillator, and
the second local oscillation signal is a signal from the first or a second Josephson oscillator.

* * * * *